United States Patent
Ziegler et al.

(10) Patent No.: US 6,784,445 B2
(45) Date of Patent: Aug. 31, 2004

(54) APPARATUS FOR MONITORING INTENTIONAL OR UNAVOIDABLE LAYER DEPOSITIONS AND METHOD

(75) Inventors: Jürgen Ziegler, Boll (DE); Reinhold Waller, Igensdorf (DE); Lothar Pfitzner, Erlangen (DE); Claus Schneider, Bubenreuth (DE); Heiner Ryssel, Erlangen (DE); Volker Tegeder, Weissig (DE)

(73) Assignees: raunhofer-Gesellschaft zur Foederung der Angewandten Forschung E.V., Munich (DE); Infineon Technologies AG, Munich (DE)

(*) Notice: Subject to any disclaimer, the term of this patent is extended or adjusted under 35 U.S.C. 154(b) by 116 days.

(21) Appl. No.: 10/033,950

(22) Filed: Dec. 28, 2001

(65) Prior Publication Data

US 2002/0089677 A1 Jul. 11, 2002

Related U.S. Application Data (63) Continuation of application No. PCT/DE00/02116, filed on Jun. 28, 2000.

(30) Foreign Application Priority Data

Jun. 28, 1999 (DE) .......................................... 199 29 615

(51) Int. Cl.[7] .............................................. G01N 21/86
(52) U.S. Cl. ................................... 250/559.27; 356/630
(58) Field of Search ....................... 250/559.27, 559.28, 250/559.19; 356/630–632, 239.1; 438/14, 16; 451/6

(56) References Cited

U.S. PATENT DOCUMENTS

| | | | |
|---|---|---|---|
| 4,141,780 A | * 2/1979 | Kleinknecht et al. | ......... 117/85 |
| 4,405,989 A | 9/1983 | Tsukada et al. | ............. 356/630 |
| 5,200,021 A | * 4/1993 | Kawai et al. | .................. 117/86 |
| 5,536,359 A | 7/1996 | Kawada et al. | ............... 438/16 |
| 5,885,352 A | 3/1999 | Miyajima | .................... 118/708 |
| 5,897,378 A | 4/1999 | Eriguchi | ..................... 438/707 |
| 6,071,375 A | * 6/2000 | Chen et al. | ............. 156/345.24 |

FOREIGN PATENT DOCUMENTS

| | | |
|---|---|---|
| DE | 27 50 421 | 5/1979 |
| DE | 34 33 531 A1 | 3/1986 |
| EP | 0 552 648 A1 | 7/1993 |
| EP | 0 712 942 A1 | 5/1996 |
| EP | 0 881 040 A2 | 12/1998 |
| JP | 63-153 269 | 6/1988 |
| JP | 01-132 767 | 5/1989 |
| JP | 04-176 866 | 6/1992 |
| JP | 05-255 850 | 10/1993 |
| JP | 05 279 878 A | 10/1993 |
| JP | 06-049 641 | 2/1994 |
| JP | 06 081 175 A | 3/1994 |
| JP | 06 160 111 A | 6/1994 |
| JP | 09-036102 | 2/1997 |
| JP | 11 131 211 A | 5/1999 |
| JP | 11 140 655 A | 5/1999 |

\* cited by examiner

*Primary Examiner*—Thanh X. Luu
(74) *Attorney, Agent, or Firm*—Laurence A. Greenberg; Werner H. Stemer; Ralph E. Locher

(57) ABSTRACT

The apparatus allows monitoring layer depositions in a process chamber. The apparatus has a light source, a sensor element, and at least one light detector. The sensor element is suitably configured in order to influence the intensity of the light beam measured by the detector by the thickness of the layer growing on the sensor element. The novel monitoring method for measuring the transmitted light intensity utilizes the apparatus. The sensor element has a continuous opening through which the intensity of the light is observed as a function of the opening grown over by the thickness of the growing layer.

48 Claims, 5 Drawing Sheets

EVALUATION DEVICE

APPARATUS FOR MONITORING INTENTIONAL OR UNAVOIDABLE LAYER DEPOSITIONS AND METHOD

CROSS-REFERENCE TO RELATED APPLICATION

This application is a continuation of copending International Application No. PCT/DE00/02116, filed Jun. 28, 2000, which designated the United States.

BACKGROUND OF THE INVENTION

Field of the Invention

The invention relates to an apparatus for monitoring intentional or unavoidable layer depositions in a process chamber and to a method for carrying out measurements with the apparatus.

In processing operations which are carried out in process chambers and wherein material is removed, which include, for example, the methods of reactive ion etching (RIE) and chemical assisted ion beam etching (CAIBE), a deposit may unintentionally be deposited on account of the starting chemicals used and the resulting reaction products on the inner wall of the reactor wherein the processing operation is carried out. Since the thickness of the deposit continually increases as the process duration increases and, once a specific layer thickness has been reached, the process carried out in the chamber interacts with this deposit to such a great extent that the process can be destabilized, this unavoidable deposit is therefore removed at periodic intervals by carrying out a special cleaning process.

While plasma etching processes or CVD (Chemical Vapor Deposition) processes are performed, polymer layers are deposited on the inside of the process chamber. The layers increase as the operating duration increases, so that after a certain layer thickness has been exceeded, the layer that has grown breaks up and fragments may possibly even drop during operation. As a result, contaminants are produced in the chamber or, if a fragment falls onto the wafer surface, circuits on the processed wafer are rendered unusable. In order to remove these undesirable depositions on the inside of the chamber, the process chamber must occasionally be subjected to wet-chemical cleaning. During the cleaning, the chamber is not available for further production.

In accordance with the prior art, the time for initiating the cleaning process is defined on the basis of empirical values obtained from the determination of the quality of the processed materials. Active monitoring of the state of the chamber wall takes place only in exceptional cases; for example, in the case of a sensor or measurement system for measuring the thickness of the deposit, a measurement principle based on the measurement of thermal capacity is used or the layer thickness is determined by means of ultrasound wave propagation times. Disadvantages of these measurement principles are, for example, the need for additional electrical bushings into the process chamber in order to link the measuring apparatuses to evaluation units. Moreover, the ultrasound wave propagation time method is temperature-sensitive and is made more difficult to carry out as a result of disturbing reflections from the structures within the process chamber.

The Japanese patent application documents JP 63-153269 A, JP 01-132767 A, JP 04-176866 A, JP 05-255850, A and JP 06-49641 disclose arranging a sensor element in the form of a monitor substrate in the region of the layer deposition and detecting the transmission and/or reflection beam emerging from a light source, that is to say the intensity change, by means of a detector and using it to set method parameters. Furthermore, Japanese patent application documents JP 11-140655 A and JP 11-131211 A disclose monitoring the chamber cleaning of a process chamber by means of photosensors, with measurement of the intensity attenuation of a light beam by the layer growing on a window in the chamber wall.

SUMMARY OF THE INVENTION

It is accordingly an object of the invention to provide an apparatus and method for monitoring layer deposition processes in a reactor chamber, which overcomes the above-mentioned disadvantages of the heretofore-known devices and methods of this general type and with which the most favorable cleaning cycle times for technological and economic process control can be determined with the lowest possible outlay.

With the foregoing and other objects in view there is provided, in accordance with the invention, an apparatus for monitoring layer depositions in a process chamber, comprising:

a light source;
a sensor element subjectable to deposition and growth of a deposition layer;
a light detector;
the sensor element having a region configured to absorb light to a significantly lesser extent than a remaining part of the sensor element, wherein an intensity of the light is measured in dependence on the region being grown over by a thickness of the deposition layer.

In accordance with an added feature of the invention, the region is a continuous opening formed in the sensor element. The region is configured to influence the intensity of the light beam measured by the detector as the thickness of the layer grows on the sensor element.

In other words, there is provided an apparatus for monitoring layer depositions in a process chamber, comprising a light source, a sensor element, at least one light detector, the sensor element being suitably configured in order to influence the intensity of the light beam measured by the detector by the thickness of the layer growing on the sensor element, and the sensor element having at least one continuous opening and/or at least one region which absorbs the light beam to a significantly lesser extent than the remaining part of the sensor element, through which opening or region the intensity of the light is measured as a function of the opening grown over by the thickness of the growing layer.

In a method for carrying out measurements with such an apparatus, a cleaning cycle time of the process chamber is determined from the intensity measurement of the light by comparing the measured light intensity with a predetermined minimum intensity or a predetermined maximum intensity.

That is, the monitoring method comprises providing an apparatus as outlined above, monitoring a layer deposition in a process chamber with the apparatus, determining a cleaning cycle time of the process chamber from an intensity measurement of the light by comparing the measured light intensity with one of a predetermined minimum intensity and a predetermined maximum intensity.

In the apparatus and the method, in order to determine the thickness of the deposit, the absorption and/or refraction of light at a concomitantly coated opening is determined and evaluated. In this case, the light source may, in principle, be of any desired configuration. Either an external light source or the use of plasma luminous phenomena is preferred as the light source. In this case, external light source does not necessarily mean that it is positioned outside the process chamber, rather it may also be situated inside the process chamber. The method according to the invention is based on the concept of introducing into the process chamber an object as sensor element, on which is deposited largely the same deposit as on the process chamber. The thickness of the deposit, which defines the state of the process chamber and thus the most favorable cleaning cycle time for technological (and economic) process control, can be determined by optical means, such as, for example, by means of light absorption and/or refraction. The method is based on the measurement of the influencing of light, for example by absorption at the sensor element. The component referred to as sensor element is introduced into the process chamber at a location at which it can be expected that a deposit will be formed similar in quality and form to that on the object to be processed/treated, in order preferably to monitor intentionally produced deposits. Specifically, in order preferably to measure unavoidable depositions, it is fitted where it can be expected that there will be a deposit similar in quality and form to that on the chamber wall. In this case, the sensor element is preferably composed of a material which completely absorbs the light used for measurement. The sensor element is preferably composed of silicon. On the sensor element, at least one continuous opening is provided, which may, in principle, be of any desired form, and the light used for measurement is observed through this opening and detected by a detector. The sensor element is thus used like a diaphragm. It is also possible for the opening or the openings not to be completely continuous spatially. What is important, however, is that they are virtually completely transmissive for the light beam. A specific embodiment of the sensor element is, for example, a layered construction of the sensor element, one layer being composed of a material which absorbs the light used and having at least one spatially continuous opening. This layer is applied to a second layer, which is composed of a material which does not absorb the light used. The order of magnitude of the spatial dimension of the opening/s is chosen within the same range as the layer thickness defined for the chamber cleaning occasion. The measurement principle is based on the observation of the light absorbed at the opening. The absorption increases as the extent to which the opening is grown over increases.

If the deposit is only weakly absorbing for the light used and the opening is grown over in the formation of a lenticular structure, then it is also possible to utilize the increasing scattering of the light at curved surfaces on account of refraction at the interfaces between deposit and surroundings, and on account of the light scattering and total reflection occurring in the deposit. The greater the thickness of the deposit, the lower the light intensity that can be measured at the detector. The cleaning cycle time or generally the coating thickness can be determined by comparing the measured light intensity with a predetermined minimum intensity. The invention thereby enables the active monitoring of the state of the chamber wall during coating, without interrupting the coating processes (in situ). In an analogous procedure, it is also possible to observe the erosion of the layer thickness associated with the cleaning operation and to determine the time required for cleaning the process chamber (cleaning time) by comparing the measured light intensity with a predetermined maximum intensity. The cleaning cycle time, or cleaning time or generally the coating thickness can be determined by comparing the measured light intensity with a predetermined intensity in an optimum manner without interrupting the coating processes. What is also advantageous about the apparatus according to the invention, in addition to the low outlay on equipment, is that additional electrical bushings into the process chamber are not necessary. The invention can be used for monitoring all processing/treatment operations wherein an intended or unintended layer deposition occurs.

Other features which are considered as characteristic for the invention are set forth in the appended claims.

Although the invention is illustrated and described herein as embodied in an apparatus for monitoring intentional or unavoidable layer depositions and method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
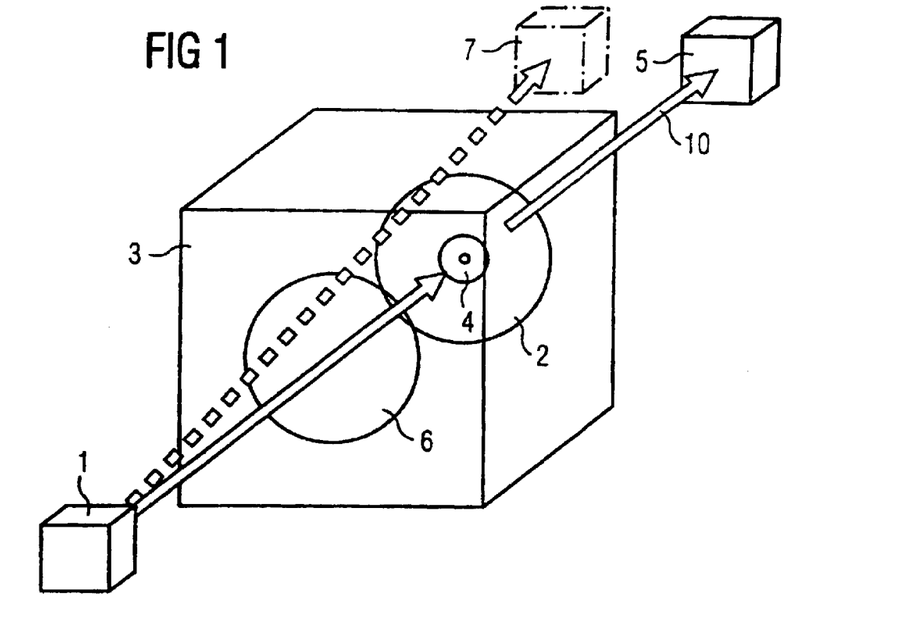
FIG. 1 is a diagrammatic perspective view of the basic configuration of an apparatus for carrying out the method according to the invention using a separate light source 1, which is preferably positioned in front of a second window 6 in a line with the sensor element and the detector.

Referring now to the figures of the drawing in detail and first, particularly, to FIG. 1 thereof, there is shown an inventive apparatus with a light source 1 that generates a light beam 10 (represented as an arrow). The light beam 10 is incident on a sensor element 4 through a window 6 in a process chamber 3. The intensity of the light, which can pass through the sensor element 4 and then leaves the process chamber via a further window 2, is measured by a detector 5. The separate light source may also be situated inside the process chamber. A reference detector 7 may be used in order to compensate for possible coating of the observation windows and/or the separate light source and the associated decrease in the light intensity or an intensity fluctuation of the light source. Otherwise, the windows must be protected against coating in the region of the light beam by the implementation of suitable measures. This may be done for example by the window being set back into a cylindrical opening.

Figure 2:
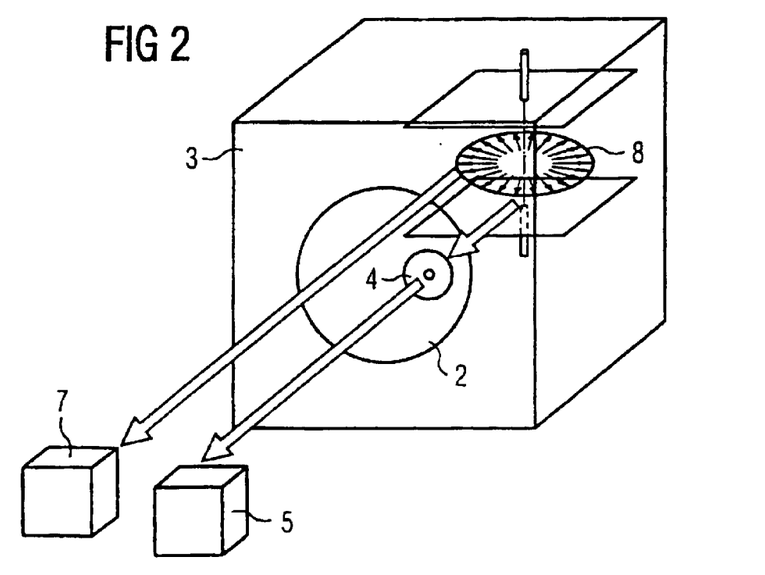
FIG. 2 is a perspective view of the basic configuration utilizing the plasma luminous phenomenon 8 as a light source with the use of a second detector 7 for reference measurement.
Figure 3:
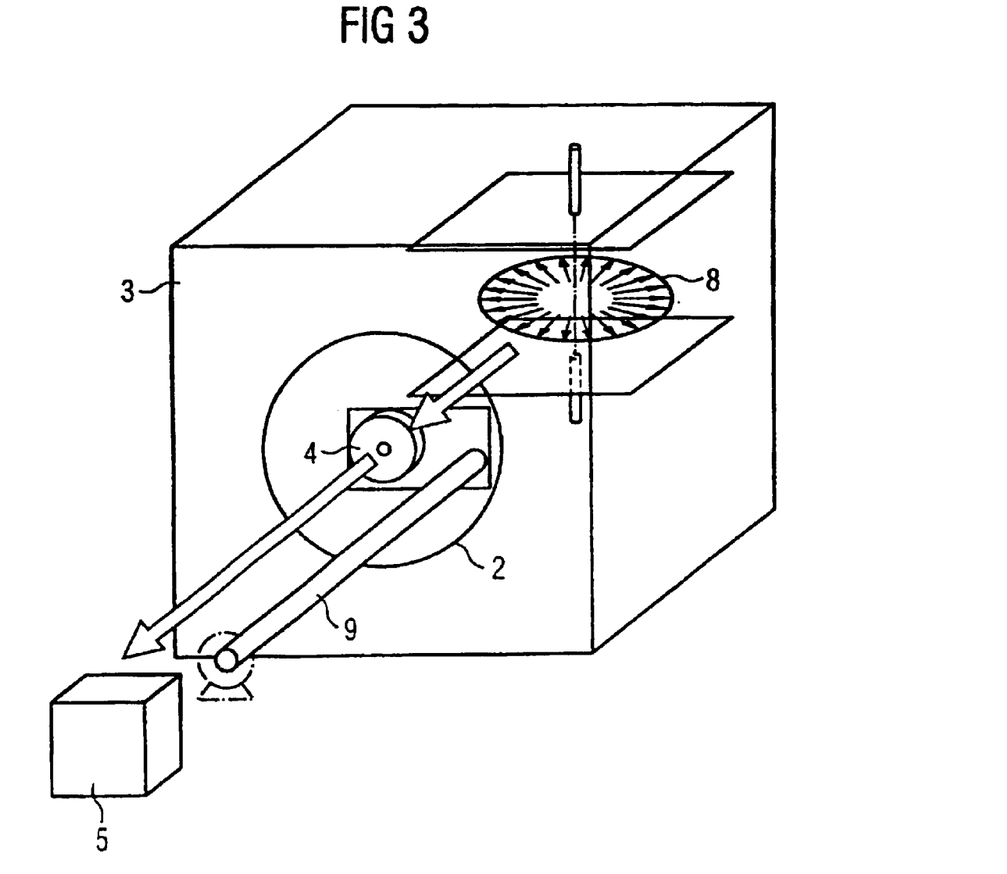
FIG. 3 is a further perspective view of the basic configuration utilizing the plasma luminous phenomenon 8 as a light source with only one detector 5 and a tilting/rotating mechanism 9 for rotating the sensor element 4 out of the beam path of the light between the plasma luminous phenomenon 8 and the detector 5.

The apparatus illustrated in FIG. 2 does not use a separate light source, but rather utilizes luminous phenomena in the plasma itself as a light source. In this case, a second detector 7 is necessary or, as illustrated in FIG. 3, a tilting/rotating mechanism 9 for rotating the sensor element out of the beam path between the light source and the detector 5, in order that the intensity of the light which passes unimpeded from the source through the window 2 into the detector 5 can be measured for reference purposes. This tilting/rotating mechanism can also be used in conjunction with a separate light source. In principle, each design of the light source is possible for carrying out the method according to the invention.

Figure 4:
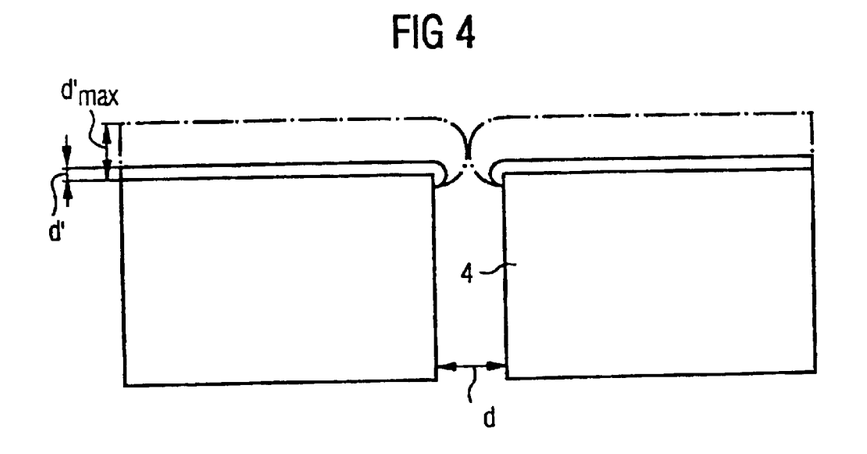
FIG. 4 is a diagrammatic side view of a detail of a cross section through the basic configuration of the sensor element with a continuous opening.

FIG. 4 illustrates a detail from the cross section through a preferred embodiment of the sensor element 4, which is positioned in the beam path of the light used for measurement. It has a continuous opening with the diameter d of the order of magnitude of the maximum layer thickness $d'_{max}$ to be detected. The three-dimensional geometrical form of the opening may be designed to be, for example, round, rectangular, slot-shaped, conical and so on. The sensor element may have one or more openings which may be arranged differently.

The method is based on the idea that, as the layer thickness d' of a deposition increases, the effective opening area of the sensor element is reduced by the opening being grown over and therefore more light is absorbed and/or scattered for example by light reflection, light refraction, total reflection at curved surfaces/interfaces (deposited layer/chamber filling). The detector used may be a simple component which reacts to the intensity of the incident light, for example a photodiode. However, it is also possible to use a complicated magnifying optical arrangement with CCD detector connected downstream for the direct optical imaging and, for example, computer-aided evaluation of the effective area. The detector system is designed as desired, in principle; the design merely has to enable measurement of the intensity of the electromagnetic radiation. Moreover, the detector system can be arranged outside and inside the process chamber, since, as a result, the contamination of the process chamber is minimized and concomitant coating of the detector system is precluded.

Figure 5:
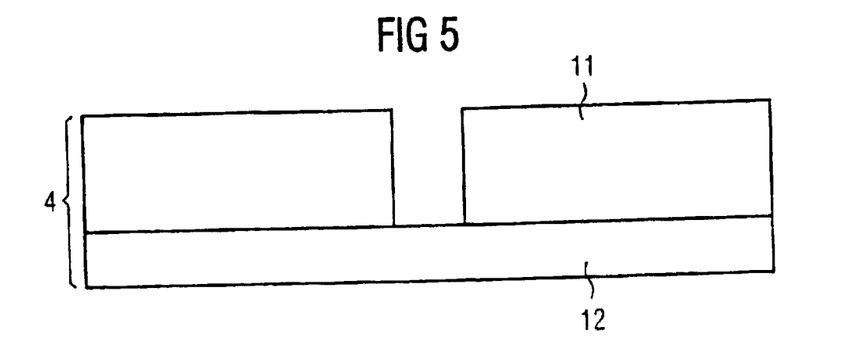
FIG. 5 is a detail of the cross section of the basic configuration of the layered sensor element with a continuous opening in a first absorbing layer and a second, non-absorbing layer.

FIG. 5 illustrates a detail from the cross section through a sensor element 4 which is constructed from two layers and is positioned in the beam path of the light used for measurement. The sensor element 4 has a continuous opening in a first absorbing layer 11 and a second, non-absorbing layer 12 without an opening. The first layer is applied to a second layer composed of a material which does not absorb the light that is used in the apparatus. In this case, too, the order of magnitude of the spatial dimension of the opening is chosen to be of the same order of magnitude as the layer thickness defined for the chamber cleaning occasion. The layer deposition preferably takes place on the side of the sensor element with the opening in the first layer that absorbs the light used. As a result of this and as a result of the setback position of the surface of the non-absorbing layer within the opening, concomitant coating of the second, non-absorbing sensor element layer is avoided to the greatest possible extent.

Figure 6:
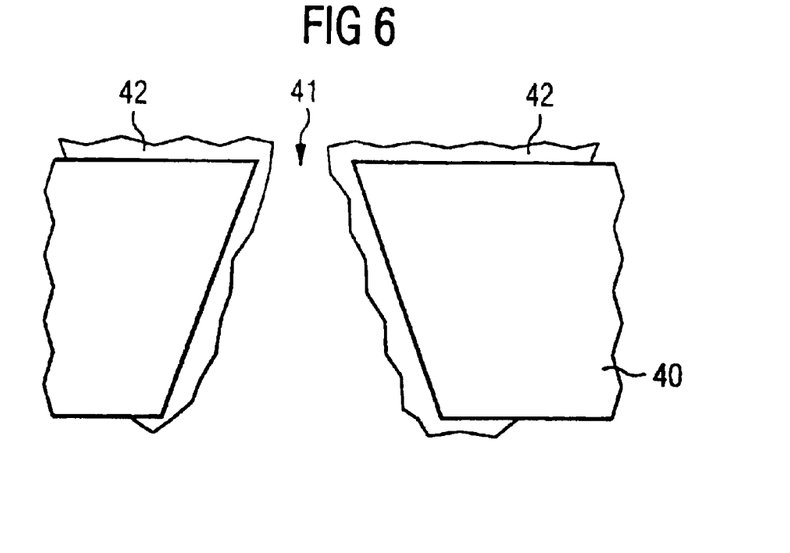
FIG. 6 is a similar view of an embodiment of an opening.

There are a multiplicity of possible variants for the design of the opening. In the case of the opening illustrated in FIG. 6, the body 40 that is opaque to light is composed of silicon. The disk 40 has two opposite surfaces between which the opening 41 extends. The opening 41 has a variable diameter along the depth of the opening. Thus, the opening diameter directed toward the inside of the process chamber is smaller than the diameter which faces away from the interior of the chamber, that is to say points toward the exterior of the chamber. Through suitable dimensioning of the opening 41 and of the light-opaque part 40 of the sensor, which dimensioning is, if appropriate, to be determined experimentally for the respective dry-etching or deposition process to be monitored, it is possible to achieve an optimization with regard to the respective process to be monitored. In particular, the form and thickness of the deposition 42 in the region of the surface of the opening 41 is determined by the thickness of the silicon disk and also by the ratio of the diameters at the ends of the opening 41 on the internal side of the chamber and external side of the chamber.

Figure 8:
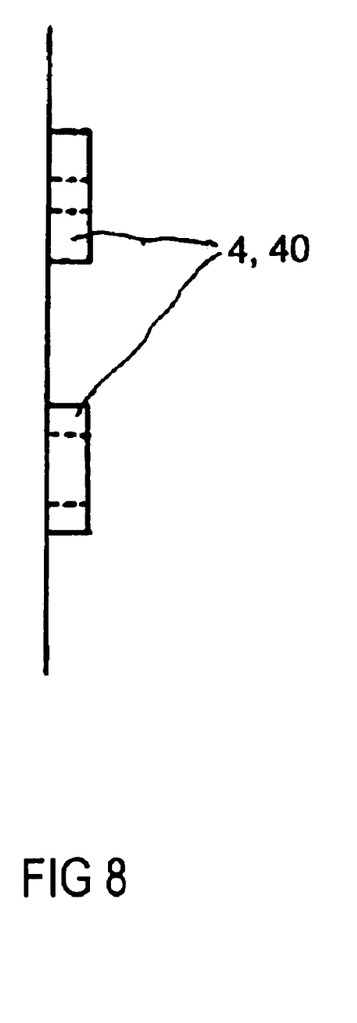
FIG. 8 schematically shows a sidewall of a process chamber with two sensor elements having openings of different sizes.

In a further refinement of the invention, it is advantageous to arrange a plurality of sensor elements 4 and/or 40 next to one another within the chamber, these sensor elements having openings of different size (see FIG. 8). The absorption behavior of the different openings is monitored simultaneously or successively. With the progressive growth of the deposited layer, e.g. 42, the smallest of the openings will first be coated opaquely, while the larger of the openings still have small absorption phenomena ranging to no absorption phenomena at all. Depending on the ratio of the absorbing openings to the as yet non-absorbing openings, it is possible to determine the degree of contamination within the chamber. The transmitted light intensity of an opening is expediently compared with an absolute threshold value or, in accordance with the embodiment according to FIG. 2, a relative threshold value. The information contribution of an opening for the measurement is thus digital. Overall, a relatively finely resolved statement about the degree of contamination inside the chamber then results for an arrangement of a plurality of openings of different diameters.

The light sensors, for example, the sensor 5 in FIGS. 1 to 3, can measure light of different predetermined wavelengths or from different predetermined ranges of wavelengths independently of one another. As a result, it is possible to effect an optimization of the measurement with regard to the absorption behavior of different layers.

Figure 7:
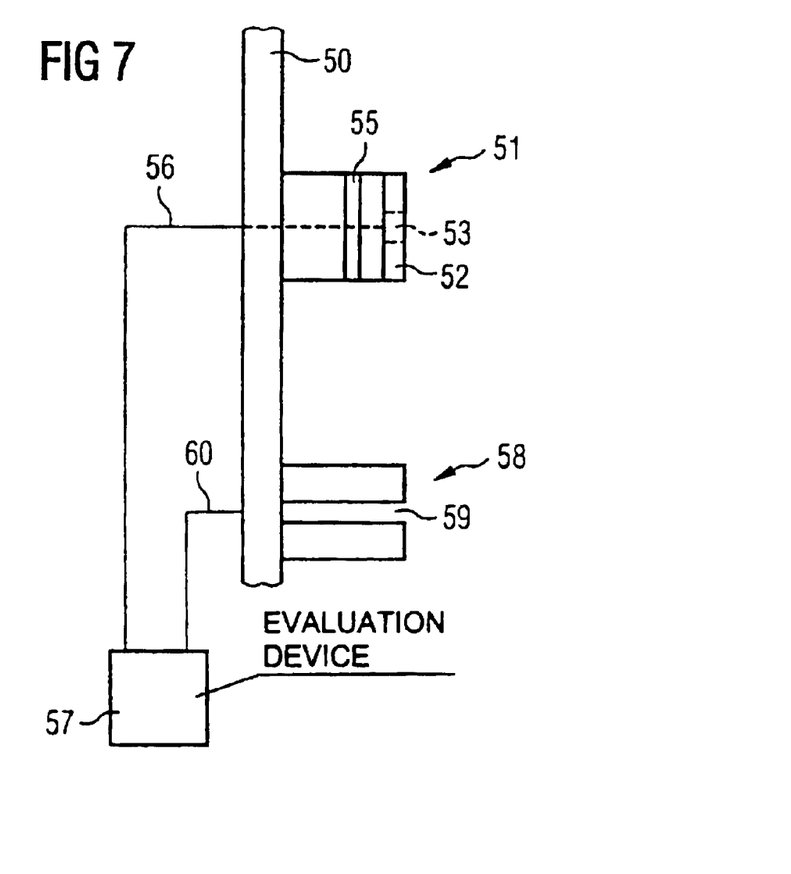
FIG. 7 is a schematic diagram of an arrangement of a measuring device on a wall of a process chamber.

FIG. 7 shows a practical implementation as a development of the principle according to FIG. 2. Both the sensor 51 and the window 52 for the reference light beam are shown on the wall 50 of the process chamber. The sensor 51 has a disk 52 which is preferably composed of silicon and into which an opening 53 is introduced. If the silicon disk 52 is coated on account of the processes taking place in the process chamber, the opening 53 narrows and its absorption increases. The light generated by the plasma is thereby attenuated when passing through the narrowed opening 53. The light passing through the opening 53 is taken up by an optical waveguide 56 and fed into an evaluation device 57. The optical window 58 receives the reference light generated by the plasma. The opening 59 is chosen such that any depositions do not influence its transmissivity. An optical waveguide 60 is once again provided in order to feed the reference light into the evaluation device 57. In particular, the process chamber wall inside the opening 59 is scarcely influenced by any undesirable depositions owing to the depth of the opening 59. The evaluation device 57 contains two light-sensitive detectors both for the measurement light path and for the reference light path. These sensors are, in particular, CCD elements.

It is particularly advantageous to provide a cooling device 55 on the sensor 51; as an alternative, the device 55 may also be a heating device. Cooling/heating depends on the respective process that is conducted. The deposition at the opening 53 can be intensified or reduced, i.e. generally controlled, through the cooling or heating of the sensor 51.

We claim:

1. An apparatus for monitoring layer depositions in a process chamber, comprising:

a light source;

a disk-shaped sensor element subjectable to deposition and growth of a deposition layer;

a light detector disposed outside the process chamber;

said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer, the intensity of the light from said light source being measured through a window formed in the process chamber.

2. The apparatus according to claim 1, wherein said region is a continuous opening formed in said sensor element.

3. The apparatus according to claim 2, wherein said opening is formed with a spatial extent in a same order of magnitude as a maximum layer thickness to be determined with the apparatus.

4. The apparatus according to claim 1, wherein said region is configured to influence the intensity of a light beam measured by said detector as the thickness of the layer grows on said sensor element.

5. The apparatus according to claim 1, wherein said light source is a separate light source generating a light beam.

6. The apparatus according to claim 1, wherein said light source is a plasma luminous phenomenon in the process chamber.

7. The apparatus according to claim 1, which comprises further detector for measuring the intensity of the light from said light source not influenced by said sensor element.

8. The apparatus according to claim 1, wherein said region is formed with a spatial extent in a same order of magnitude as a maximum layer thickness to be determined with the apparatus.

9. The apparatus according to claim 1, wherein said sensor element is provided with a cooling device for cooling said sensor element.

10. The apparatus according to claim 1, wherein said sensor element is provided with a heating device for heating said sensor element.

11. The apparatus according to claim 1, wherein said sensor element is one of at least two sensor elements and said light detector is one of at least two light detectors respectively associated with said sensor elements and configured to generate a measurement signal representing the intensity of the light transmitted by said sensors, and wherein an evaluation device is connected to said sensor elements for processing the measurement signals in dependence on one another.

12. In combination with a process chamber for depositing or removing layers, the apparatus according to claim 1 adapted and disposed to monitor a growth or a removal of the layers in the process chamber.

13. A monitoring method, which comprises providing an apparatus according to claim 1, monitoring a layer deposition in a process chamber with the apparatus, determining a cleaning cycle time of the process chamber from an intensity measurement of the light by comparing the measured light intensity with one of a predetermined minimum intensity and a predetermined maximum intensity.

14. An apparatus for monitoring layer depositions in a process chamber, comprising:

a light source being a separate light source generating a light beam;

a disk-shaped sensor element subjectable to deposition and growth of a deposition layer;

a light detector;

said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer, said light source being disposed in front of a window formed in the process chamber in a line with said sensor element and said detector.

15. The apparatus according to claim 14, wherein said region is a continuous opening formed in said sensor element.

16. The apparatus according to claim 14, wherein said region is configured to influence the intensity of a light beam measured by said detector as the thickness of the layer grows on said sensor element.

17. The apparatus according to claim 14, wherein said light source is a plasma luminous phenomenon in the process chamber.

18. The apparatus according to claim 14, wherein said region has a varying diameter.

19. The apparatus according to claim 15, wherein said opening extends from said first surface to said second surface and said opening has a varying diameter.

20. The apparatus according to claim 14, wherein said sensor element is one of at least two sensor elements and said light detector is one of at least two light detectors respectively associated with said sensor elements and configured to generate a measurement signal representing the intensity of the light transmitted by said sensors, and an evaluation device is connected to said sensor elements for processing the measurement signals in dependence on one another.

21. An apparatus for monitoring layer depositions in a process chamber, comprising:

a light source;

a disk-shaped sensor element subjectable to deposition and growth of a deposition layer;

a light detector;

said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer; and a tilting/rotating mechanism enabling said sensor element to be tilted/rotated out of a beam path of the light.

22. The apparatus according to claim 21, wherein said mechanism is enabled to tilt/rotate said sensor element out of a light path from a plasma luminous phenomenon defining said light source to said detector.

23. The apparatus according to claim 21, wherein said region is a continuous opening formed in said sensor element.

24. The apparatus according to claim 21, wherein said region is configured to influence the intensity of a light beam measured by said detector as the thickness of the layer grows on said sensor element.

25. The apparatus according to claim 21, wherein said light source is a separate light source generating a light beam.

26. The apparatus according to claim 21, wherein said light source is a plasma luminous phenomenon in the process chamber.

27. The apparatus according to claim 21, wherein said region has a varying diameter.

28. The apparatus according to claim 23, wherein said opening extends from said first surface to said second surface and said opening has a varying diameter.

29. The apparatus according to claim 21, wherein said sensor element is one of at least two sensor elements and said light detector is one of at least two light detectors respectively associated with said sensor elements and configured to generate a measurement signal representing the intensity of the light transmitted by said sensors, and an evaluation device is connected to said sensor elements for processing the measurement signals in dependence on one another.

30. An apparatus for monitoring layer depositions in a process chamber, comprising:
a light source being a separate light source generating a light beam;
a disk-shaped sensor element subjectable to deposition and growth of a deposition layer;
a light detector;
said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer; and
a tilting/rotating mechanism enabling said sensor element to be tilted/rotated out of a beam path of said light beam from said light source to said detector.

31. The apparatus according to claim 30, wherein said region is a continuous opening formed in said sensor element.

32. The apparatus according to claim 30, wherein said region is configured to influence the intensity of a light beam measured by said detector as the thickness of the layer grows on said sensor element.

33. The apparatus according to claim 30, wherein said light source is a plasma luminous phenomenon in the process chamber.

34. The apparatus according to claim 30, wherein said region has a varying diameter.

35. The apparatus according to claim 31, wherein said opening extends from said first surface to said second surface and said opening has a varying diameter.

36. The apparatus according to claim 30, wherein said sensor element is one of at least two sensor elements and said light detector is one of at least two light detectors respectively associated with said sensor elements and configured to generate a measurement signal representing the intensity of the light transmitted by said sensors, and an evaluation device is connected to said sensor elements for processing the measurement signals in dependence on one another.

37. An apparatus for monitoring layer depositions in a process chamber, comprising:
a light source;
a disk-shaped sensor element subjectable to deposition and growth of a deposition layer;
a light detector;
said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer; and
said region having a varying diameter.

38. The apparatus according to claim 37, wherein said region is a continuous opening formed in said sensor element.

39. The apparatus according to claim 37, wherein said region is configured to influence the intensity of a light beam measured by said detector as the thickness of the layer grows on said sensor element.

40. The apparatus according to claim 37, wherein said light source is a separate light source generating a light beam.

41. The apparatus according to claim 37, wherein said light source is a plasma luminous phenomenon in the process chamber.

42. The apparatus according to claim 38, wherein said opening extends from said first surface to said second surface.

43. The apparatus according to claim 37, wherein said sensor element is one of at least two sensor elements and said light detector is one of at least two light detectors respectively associated with said sensor elements and configured to generate a measurement signal representing the intensity of the light transmitted by said sensors, and an evaluation device is connected to said sensor elements for processing the measurement signals in dependence on one another.

44. An apparatus for monitoring layer depositions in a process chamber, comprising:
a light source;
a disk-shaped sensor element subjectable to deposition and growth of a deposition layer;
a light detector;
said sensor element having a first surface on one side of said sensor element, a second surface on an opposite side of said sensor element, and a region extending from said first surface to said second surface, said region being configured for light to pass through and to absorb light to a significantly lesser extent than a remaining part of said sensor element, an intensity of the light being measured in dependence on said region being grown over by a thickness of the deposition layer; and
said region being a continuous opening formed in said sensor element, said opening extending from said first surface to said second surface and said opening having a varying diameter.

45. The apparatus according to claim 44, wherein said region is configured to influence the intensity of a light beam measured by said detector as the thickness of the layer grows on said sensor element.

46. The apparatus according to claim 44, wherein said light source is a separate light source generating a light beam.

47. The apparatus according to claim 44, wherein said light source is a plasma luminous phenomenon in the process chamber.

48. The apparatus according to claim 44, wherein said sensor element is one of at least two sensor elements and said light detector is one of at least two light detectors respectively associated with said sensor elements and configured to generate a measurement signal representing the intensity of the light transmitted by said sensors, and an evaluation device is connected to said sensor elements for processing the measurement signals in dependence on one another.

* * * * *

UNITED STATES PATENT AND TRADEMARK OFFICE
CERTIFICATE OF CORRECTION

PATENT NO.    : 6,784,445 B2
DATED         : August 31, 2004
INVENTOR(S)   : Jürgen Ziegler et al.

It is certified that error appears in the above-identified patent and that said Letters Patent is hereby corrected as shown below:

<u>Title page,</u>
Item [73], Assignees, should read as follows:
-- Fraunhofer-Gesellschaft zur Förderung der Angewandten Forschung E.V., Munich (DE); Infineon Technologies SC300 GmbH & Co. KG, Dresden (DE) --

Signed and Sealed this

Fourth Day of January, 2005

JON W. DUDAS
*Director of the United States Patent and Trademark Office*